US006934521B1

(12) United States Patent
Fleury et al.

(10) Patent No.: US 6,934,521 B1
(45) Date of Patent: *Aug. 23, 2005

(54) SYSTEM FOR AUTOMATICALLY SETTING A PORTABLE OBJECT WITH A CLOCK FUNCTION

(75) Inventors: Emmanuel Fleury, Moutier (CH); Fabien Blondeau, Le Landeron (CH); David Barras, Grenchen (CH); Pierre-André Meister, Biel (CH)

(73) Assignee: Eta SA Fabriques d'Ebauches, Grenchen (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/048,288

(22) PCT Filed: Nov. 26, 1999

(86) PCT No.: PCT/EP99/09218

§ 371 (c)(1),
(2), (4) Date: Jan. 29, 2002

(87) PCT Pub. No.: WO01/09689

PCT Pub. Date: Feb. 8, 2001

(30) Foreign Application Priority Data

Aug. 3, 1999 (EP) .................................. 99115319

(51) Int. Cl.[7] .......................... H04B 1/18; G04B 23/02; G04C 21/00

(52) U.S. Cl. ............................. 455/171.1; 455/181.1; 368/72; 368/73; 368/74

(58) Field of Search ...... 455/171.1, 181.1; 368/72–74, 368/250, 255

(56) References Cited

U.S. PATENT DOCUMENTS 6,577,559 B1 * 6/2003 Fleury et al. ............... 368/250
6,747,916 B1 * 6/2004 Fleury et al. ................ 368/10

* cited by examiner

*Primary Examiner*—Lee Nguyen
*Assistant Examiner*—Yuwen Pan
(74) *Attorney, Agent, or Firm*—Sughrue Mion, PLLC

(57) ABSTRACT

The present invention concerns an automatic time-setting system for a portable object having an horological function. The present invention also concerns a portable object having an horological function capable of being automatically set to the right time, such as an electronic timepiece.

According to the present invention, the portable object (100) includes means (11) for receiving an acoustic time-setting signal (50) and means (12, 13) for deriving time-setting indications (ho, mo) from this acoustic time-setting signal (50) allowing said time indication of the portable object (100) to be corrected.

According to the present invention, the portable object may advantageously be set to the right time via an acoustic time-setting signal (50) transmitted for example by the loud speaker of a personal computer, a television, a radio or a telephone receiver.

9 Claims, 3 Drawing Sheets

SYSTEM FOR AUTOMATICALLY SETTING A PORTABLE OBJECT WITH A CLOCK FUNCTION

The present invention generally concerns an automatic time-setting system for a portable object having an horological function. The present invention also concerns a portable object having an horological function, such as an electronic timepiece, which is capable of being automatically set to the right time.

Within the meaning of the present invention, a "portable object having an horological function" means any object of small dimensions such as, in a preferred but non-limiting manner, an electronic timepiece, capable of processing and displaying at least a first time-related information, such as the time and/or the date.

Electronic watches or clocks capable of being automatically set to the right time via a radio-broadcast time signal emitted by an observatory or time institute are already known. Such objects are known by the name of "radio-synchronised" watches or clocks or by the equivalent terms "radio-controlled" or "radio-driven".

U.S. Pat. No. 4,315,332 discloses for example a timepiece including a radio receiver arranged for receiving and decoding a radio-broadcast time signal and correction means replying to said time signal to correct the time displayed by the timepiece.

One drawback of such timepieces, and other portable objects having an horological function and relying on a radio-broadcast time-setting signal, lies in the fact that the timepiece, or more generally the portable object having an horological function, must necessarily include means for receiving the radio-broadcast signal. These receiving means typically include an radio-receiver antenna, which is adjusted or capable of being adjusted to the transmission frequency of the radio-broadcast signal. These receiving means are not commonly present in a conventional electronic timepiece and are moreover typically characterised by a relatively high cost price which has an impact on the manufacturing cost of the portable object.

Another drawback of such portable objects lies in the fact that setting the time of such portable objects requires the portable object to be tuned to the transmission frequency of the radio-broadcast time signal. In particular, this time signal transmission frequency may vary from one region or country to another. By way of example, the Prangins transmitter in Switzerland, known by the registration number HBG, transmits a radio-broadcast time signal at a frequency of 75 kHz, the Mainflingen transmitter in Germany, known under the registration number DCF77, transmits the radio-broadcast time signal at a frequency of 77.5 kHz and the Rugby transmitter in Great Britain, known under the registration number MSF, transmits the radio-broadcast time signal at a frequency of 60 kHz. Consequently, in order to assure that such radio-synchronised portable objects work properly, they have to be fitted with additional means allowing the radio-broadcast time signal receiving frequency to be tuned in accordance with the place where the user is located. These additional means further increase the manufacturing costs and complexity of these portable objects.

A first object of the present invention is thus to propose a solution allowing the automatic time-setting of a portable object having an horological function which overcomes the aforementioned drawbacks.

In particular, an object of the present invention is to propose a solution allowing the automatic time-setting of a portable object having an horological function which preferably relies only on means with which said portable object is already fitted or which require only the smallest possible adjustment to the portable object electronic circuit.

The present invention thus concerns a system allowing the automatic time-setting of a portable object having an horological function whose features are listed in claim 1.

The present invention also concerns a portable object having an horological function, such as an electronic timepiece, capable of being automatically set to the right time, whose features are listed in claim 4.

Advantageous embodiments of the present invention, described in the following description, form the subject of the dependent claims.

According to the present invention, a time-setting signal or time signal is advantageously transmitted to the portable object having an horological function via acoustic waves. This solution has the essential advantage of requiring acoustic signal transmission means, such as a loudspeaker, which are conventionally found in numerous electronic apparatus. In particular, the acoustic time-setting signal may be transmitted to the portable object having an horological function via the loudspeaker of a personal computer, or the loudspeaker of a television, radio or telephone receiver, or by means of another object capable of transmitting an acoustic signal.

In particular, according to an advantageous embodiment of the present invention, the portable object having an horological function, such as an electronic timepiece, includes a sound generator circuit conventionally used to transmit a determined acoustic signal, such as an acoustic alarm signal, and which is arranged for receiving and converting an incident acoustic signal carrying time-setting information into a signal for correcting the time information displayed by said portable object.

According to this advantageous embodiment, the portable object having an horological function may also, by way of improvement, transmit an acoustic time-setting signal to another similar portable object.

These objects, features and advantages of the present invention, in addition to others, will appear more clearly upon reading the following detailed description, made with reference to the annexed drawings, given by way of non-limiting examples and in which.

Figure 1:
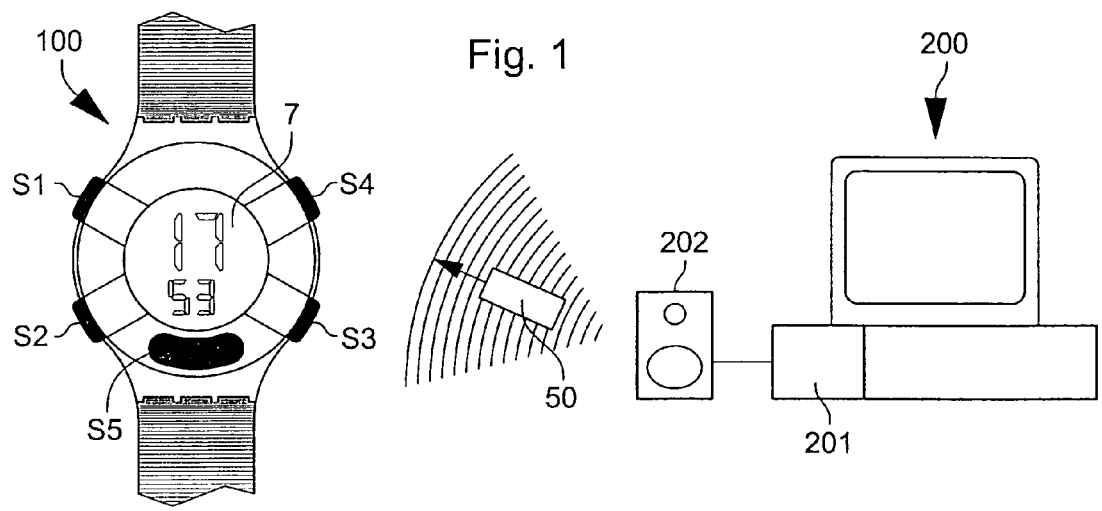
FIG. 1 illustrates schematically an example embodiment of an automatic time-setting system for a portable object having an horological function, such as an electronic timepiece, according to the present invention.

FIG. 1 shows schematically an automatic time-setting system for a portable object having an horological function, such as an electronic timepiece, designated as a whole by the general reference numeral 100, this system constituting an embodiment of the present invention. This system further includes, in a non limiting manner, a computer terminal or a personal computer, designated by the reference numeral 200.

In accordance with the invention, personal computer 200 includes at least means for transmitting an acoustic time-setting signal, this acoustic time-setting signal being schematised by the block bearing the reference numeral 50. In the example shown in FIG. 1, these acoustic time-setting signal transmission means take the form of a sound card 201 with which personal computer 200 is typically fitted and one or more loud speakers 202.

The transmission means are independent of the type of equipment used. Thus, acoustic time-setting signal 50 may alternatively be transmitted via a television or radio loud speaker, in particular in order to allow the portable object to be set to the right time, for example when an advertisement passes on the television or radio. The acoustic time-setting signal may also be transmitted via a telephone receiver loud speaker, in particular to allow the portable object to be set to the right time, for example following a call to an automatic time-setting telephone service.

One of the advantages of the present invention thus lies in the fact that means which are typically already present are advantageously used to transmit the time-setting signal. Indeed, in order to implement the invention, one need only enter into the computer a program allowing it to modulate the acoustic signal so that the signal can then be decoded properly by portable object 100.

Preferably, personal computer 200, or any other computer terminal such as a game console, is connected to a wide area computer network, such as the internet, so as to allow a user to be connected to a determined site, accessible via this wide computer network, and providing at least a time-related information. This site may easily be arranged so that it causes, for example following an action of the user on the internet site, the transmission, via loud speaker 202 of personal computer 200, of an acoustic time-setting signal derived from the time reading provided by the site. Advantage can thus be taken of the fact that personal computer 200 is connected to this wide area computer network, like the internet, to set the time from a time reading provided by a determined internet site.

In the event that a television or radio loudspeaker is used, the appropriately modulated acoustic time-setting signal should be transmitted over a determined television channel or a determined radio station, this acoustic time-setting signal being relayed to the person wearing the portable object via the television loudspeaker or radio loudspeaker.

Likewise, in the case of time-setting by telephone, the acoustic time-setting signal may perfectly well be transmitted properly modulated on the telephone line and be relayed by the telephone receiver loud speaker.

Electronic timepiece 100 illustrated in FIG. 1 includes display means, designated by the reference numeral 7, such as a liquid crystal display and control members, such as push-buttons S1 to S5 which the user may activate as he wishes to select functions and/or modify the timepiece information or data, for example in order to manually correct the time displayed by the latter.

According to the present invention, timepiece 100 further includes in particular receiving means, not shown in this Figure, adapted for receiving an acoustic time-setting signal 50 transmitted, for example, by means of loud speaker 202 of the personal computer of FIG. 1.

It will be noted that these acoustic time-setting signal receiving means may be any type of electro-acoustic transducer capable of generating an electric signal from an incident acoustic signal. The notion of "electro-acoustic transducer" encompasses both piezoelectric type transducers and electrodynamic type transducers.

Figure 2:
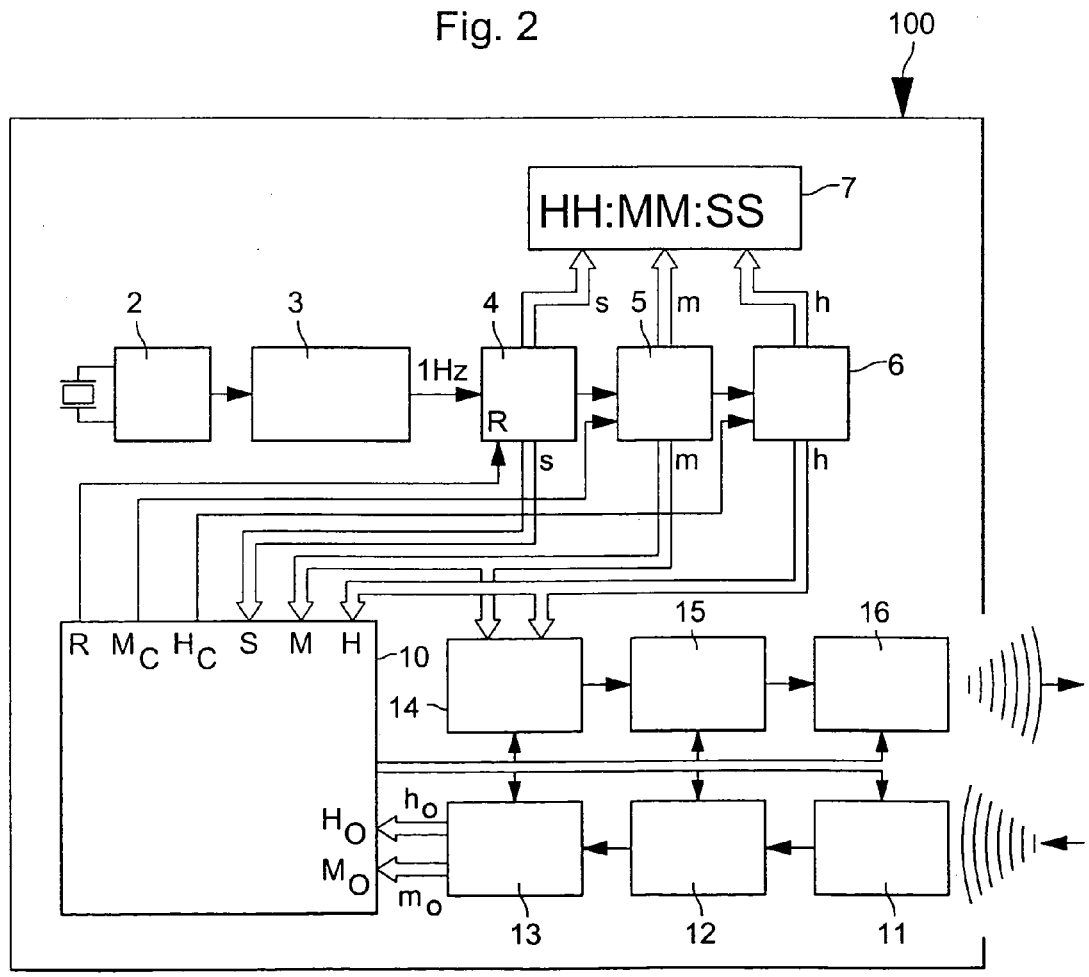
FIG. 2 shows a detailed block diagram of a non-limiting example of a timepiece able to be automatically set to the right time.

FIG. 2 shows, in the form of a block diagram, an example embodiment of electronic timepiece 100 of FIG. 1. As can be seen in FIG. 2, the timepiece, designated as a whole by the reference 100, includes, in series, a quartz oscillator 2, a division chain 3 supplying a signal at 1 Hz, for example, a seconds counter 4, a minutes counter 5 and an hours counter 6. The seconds counter 4 conventionally provides one pulse per minute allowing minutes counter 5 to be incremented and minutes counter 5 conventionally provides one pulse per hour allowing hours counter 6 to be incremented. Counters 4, 5 and 6 thus generate respectively an indication of the second s, minute m and hour h.

These indications of the second s, minute m and hour h are supplied to display means 7, like the liquid crystal display already mentioned with reference to FIG. 1. These same indications s, m and h are also supplied to electronic control means, generally designated by the reference numeral 10. These electronic control means 10 include in particular inputs, indicated M and H, respectively connected to counters 5 and 6 for receiving the minute m and hour h indications.

It will be noted that the electronic control means may be made in the form of a microcontroller or microprocessor programmed to make it fulfil the functions listed in the present description.

These electronic control means 10 include in particular outputs, indicated R, Mc and Hc for supplying correction pulses allowing the indications of the second s, minute m and hour h of counters 4, 5 and 6 respectively to be corrected. In particular, output R of electronic control means 10 supply a reset pulse for seconds counter 4, and outputs Mc and Hc supply respectively correction pulses for minutes counter 5 and hours counter 6.

Outputs R, Mc and Hc typically supply these correction pulses to counters 4, 5 and 6 when the timepiece is manually set to the right time. For this purpose, the timepiece includes control means, designated by the reference numeral 8, able to be activated from the exterior by a user. These control means 8 include in particular push-buttons S1 to S5 of the timepiece which are shown in FIG. 1. In response to an action on these control means 8, electronic control means 10 thus typically supply correction pulses to counters 4, 5 and 6.

According to the present invention, the timepiece further includes, in series and activated by electronic control means 10, means for receiving the acoustic time-setting signal, designated by the reference numeral 11, such as an electro-acoustic transducer, amplifying means 12 for amplifying the electric signal generated by receiving means 11 in response to the acoustic time-setting signal and demodulating means 13 allowing time-setting indications ho and mo to be derived from the acoustic time-setting signal. These time-setting indications ho and mo are supplied to inputs Ho and Mo of electronic control means 10.

Electronic control means 10 are arranged so that they compare in particular the hour and minute indications h and m supplied by counters 5 and 6 to time-setting indicators ho and mo derived from acoustic time-setting signal 50. In response to this comparison, electronic control means 10 supply at their output R, Nc and Hc the proper number of correction pulses to make the timepiece time coincide with the time transmitted by means of acoustic time-setting signal 50.

Preferably, the timepiece is also arranged to transmit an acoustic time-setting signal to another timepiece or similar portable object of the system. The timepiece illustrated in FIG. 2 thus also includes, preferably, in series and activated by electronic control means 10, modulating means 14 and drive means 15 associated with means for transmitting an acoustic time-setting signal, indicated by the reference numeral 16. Modulating means 14 allow a modulated electric signal to be produced at their output from indications m and h provided respectively by minute and hour counters 5 and 6. Drive means 15 allow a command signal to be produced allowing transmission means 16 to be acted on in response to the modulated electric signal provided by the modulating means so that they transmit, in response, an acoustic time-setting signal.

It will be noted that acoustic time-setting signal transmission means 16 may be any type of electro-acoustic transducer capable of producing an acoustic signal from an electric command signal. The term "electro-acoustic transducer" thus includes both piezoelectric type transducers and electrodynamic type transducers.

Thus, an advantage of this variant of the timepiece lies in the fact that a person wearing such a timepiece, or a similar portable object having an horological function and answering the aforementioned features, may itself transmit an acoustic time-setting signal to another person wearing such a timepiece. This variant for example enables a traveller equipped with such a timepiece, in particular when he changes time zones, to set his watch to the right time via another similar timepiece worn by a person who lives in such time zone.

By way of simplifying the timepiece illustrated in FIG. 2, the acoustic time-setting signal receiving means 11 and transmission means 16 may use a single same electro-acoustic transducer which operates in a reversible manner.

By way of particularly advantageous variant, the timepiece is fitted with a sound generator circuit arranged so as to be also able to receive the acoustic time-setting signal. European Patent Application No. 99115319.8, also in the name of the Applicant, and for which a priority is claimed within the scope of the present invention, discloses for example the use of a sound generator circuit including a piezo-electric transducer as an acoustic signal receiver. This European Patent Application, incorporated herein by reference, discloses in particular an electronic converter an illustration of which is shown in FIG. 3.

Figure 3:
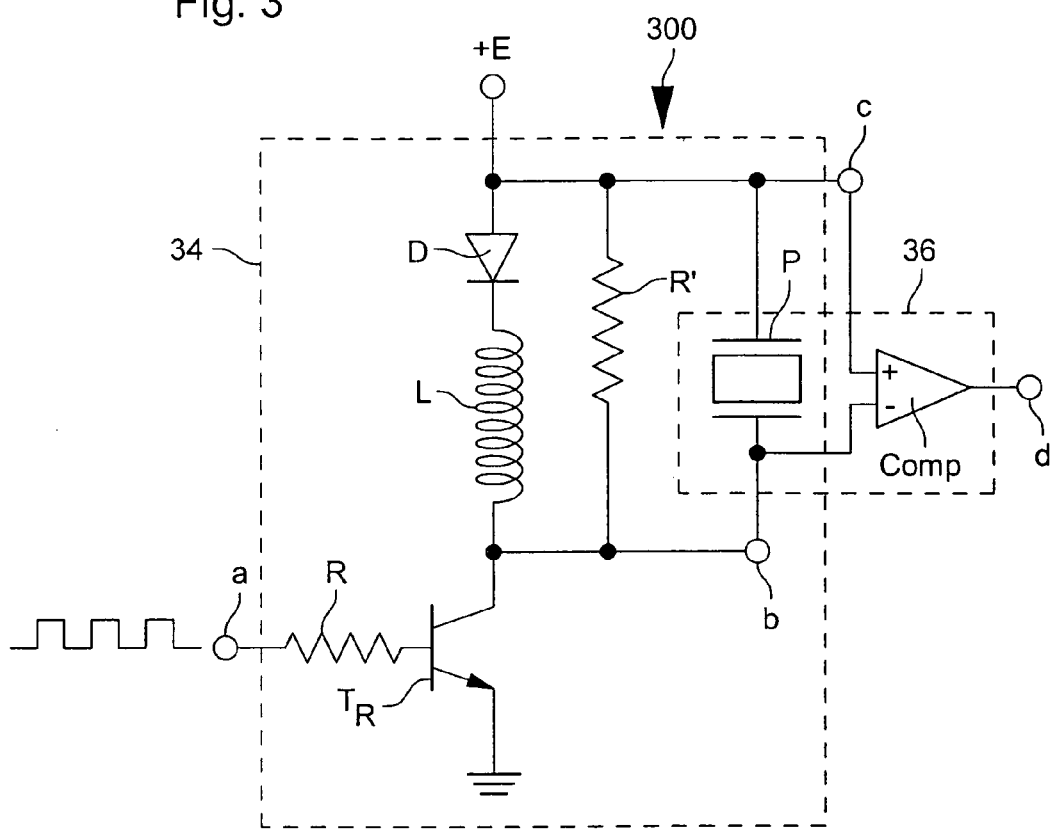
FIG. 3 shows an electric diagram of a converter circuit for an acoustic signal able to be used as means for receiving the acoustic time-setting signal.

FIG. 3 thus shows a sound generator circuit including an electronic converter designated as a whole by the reference numeral 300. As this appears from the Figure, the aforementioned electronic converter 300 is formed by associating a drive circuit 34, a piezoelectric vibrator P and a comparing circuit 36 whose respective operating principles will be described hereinafter.

Drive circuit 34 of piezoelectric vibrator P includes a circuit branch in which a coil L and a diode D are mounted in series, a resistor R' and piezoelectric vibrator P being connected in parallel across this circuit branch.

Figure 4:
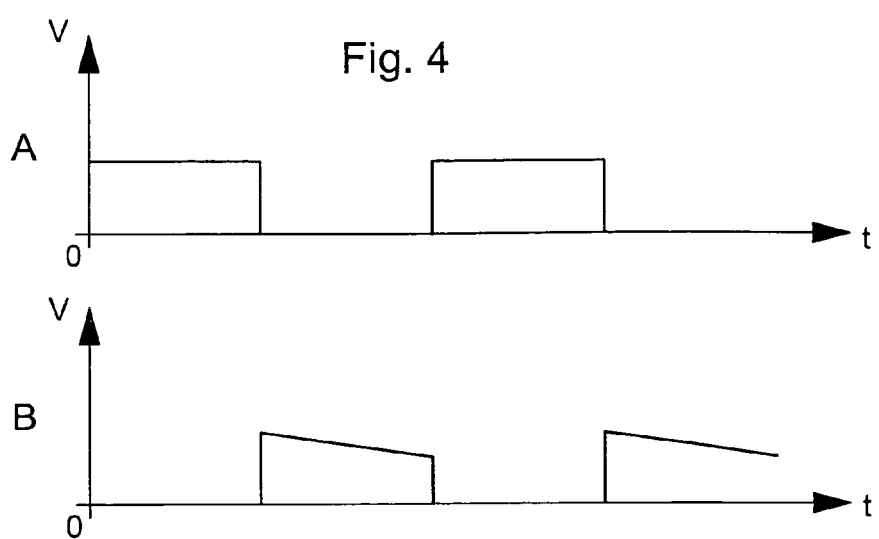
FIG. 4 shows the voltage levels as a function of time at two places in the circuit of FIG. 3 when this circuit is used as a sound generator.

Drive circuit 34 receives at an input terminal "a" a square pulse control signal as is shown by curve A in FIG. 4. This control signal is applied through a resistor R at the base of a transistor $T_R$. When transistor $T_R$ is made conducting by a control pulse, a current supplied by a supply voltage +E passes through coil L, whereas the connection node "b" of piezoelectric vibrator P is connected to drive circuit 34's ground potential. When transistor $T_R$ passes to the non conducting state on the falling edge of each control pulse, all the energy accumulated in coil L is transmitted to the terminals of vibrator P, charging the latter to a determined voltage (curve B of FIG. 4) higher than supply voltage +E. When, in turn, vibrator P begins to be discharged, diode D blocks the return of the current. It will be noted that between two successive control pulse signals, piezoelectric vibrator P may in any event be partially discharged through resistor R'. Thus, when there is no longer any control signal applied to transistor $T_R$ and the latter is thus in the conducting state, the voltage across the terminals of vibrator P gradually returns to its rest value.

Comparing circuit 36 includes comparing means formed by an analogue-digital comparator COMP. One of the inputs of comparator COMP is connected to a connection node "c" of dc supply voltage +E, whereas the other input of said comparator COMP is connected to output node "b" of drive circuit 34, in other words to the connection node between piezoelectric vibrator P and transistor $T_R$. As already specified hereinbefore, in the absence of a control signal applied at the base of transistor $T_R$, vibrator P is at rest and the voltage across its terminals is equal to supply voltage +E. In these conditions, piezoelectric vibrator P is no longer used as a sound generator but may, on the contrary, be used as a receiver for an acoustic signal, and in particular for the acoustic time-setting signal according to the present invention.

Figure 5:
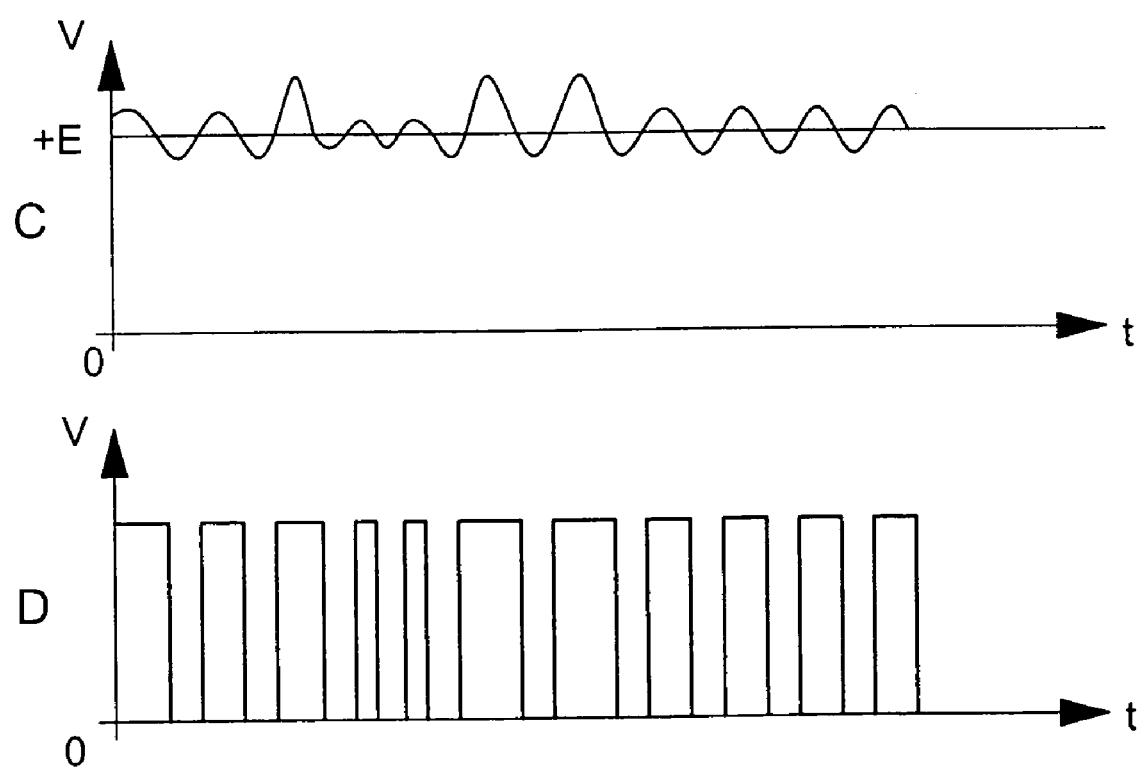
FIG. 5 shows the voltage levels as a function of time at two places in the circuit of FIG. 3 when this circuit is used as an acoustic time-setting signal receiver.

Thus, via the effect of an incident acoustic signal, such as the acoustic time-setting signal the voltage across the terminals of vibrator P will start to oscillate on either side of its rest voltage +E as curve C of FIG. 5 shows. Comparator COMP then compares the voltage generated by vibrator P with its reference value which is supply voltage +E of drive circuit 34. Each time the voltage generated by the piezoelectric vibrator exceeds the reference voltage +E, comparator COMP will generate a pulse signal at its output "d" (curve D of FIG. 5). It is thus possible to transform an incident acoustic signal into a modulated electric signal, here a frequency modulated electric signal, and to derive from this electric signal, in particular the time indications ho and mo mentioned with reference to FIG. 2.

It will be understood that various modifications and/or adaptations may be made to the embodiments described in the present invention without however departing from the scope of the invention defined by the annexed claims.

What is claimed is:

1. System allowing the time-setting of at least a portable object (100) having an horological function, this system including at least means (201, 202) for transmitting an acoustic time-setting signal (50) for correcting a time indication of said portable object (100), this portable object (100) including means (11) for receiving said acoustic time-setting signal (50) and means (12, 13) for deriving time-setting indications (ho, mo) from said acoustic time-setting signal (50) allowing said time indication of said portable object (100) to be corrected, characterised in that said portable object (100) is further adapted to transmit an acoustic time-setting signal (50), this portable object (100) including means (16) for transmitting an acoustic time-setting signal (50).

2. System according to claim 1, characterised in that said portable object (100) includes a sound generator circuit (300) in particular for generating an acoustic alarm signal, this sound generator circuit (300) also forming said means for receiving (11) and transmitting (16) the acoustic time-setting signal (50).

3. System according to claim 2, characterised in that said sound generator circuit (300) includes a piezoelectric vibrator (P) forming an acoustic wave transceiver and switching means ($T_R$) arranged to switch on and off upon reception of a pulse control signal, and a circuit branch in which a coil (L) and a diode (D) are connected in series with said switching means ($T_R$), a resistor (R') and said piezoelectric vibrator (P) being connected, in parallel with said coil (L) and said diode (D), in series with said switching means ($T_R$), said sound generator circuit (300) further including comparing means (36, COMP) for comparing the voltage across the terminals of said piezoelectric vibrator (P) with a reference voltage (+E) when an acoustic time-setting signal (50) is received.

4. System according to claim 1, characterised in that this system includes a personal computer (200), a television, a radio or a telephone receiver including a loud speaker (202) forming said transmission means for the acoustic time-setting signal (50).

5. System according to claim 2, including said personal computer (200) including a loud speaker (202) forming said transmission means for the acoustic time-setting signal (50), characterised in that said personal computer is connected to a wide area computer network, such as the internet, and in that the acoustic time-setting signal (50) is derived from a time indication provided by a determined site accessible via said wide area computer network.

6. Portable object (100) having an horological function capable of being automatically set to the right time including means for receiving (11) an acoustic time-setting signal (50) and means (12, 13) for deriving time-setting indications (ho, mo) from said acoustic time-setting signal (50) allowing a time indication of the portable object to be corrected, characterised in that said portable object (100) is further adapted to transmit an acoustic time-setting signal (50) and in that it includes transmission means (11) for said acoustic time-setting signal (50).

7. Portable object according to claim 6, characterised in that it further includes a sound generator circuit (300) in particular for generating an acoustic alarm signal, this sound generator circuit (300) also forming said receiving (11) and transmission (16) means for said acoustic time-setting signal (50).

8. Portable object according to claim 7, characterised in that said sound generator circuit (300) includes a piezoelectric vibrator (P) forming an acoustic wave receiver and switching means ($T_R$) arranged for switching on and off upon reception of a pulse control signal, and a circuit branch in which a coil (L) and a diode (D) are mounted in series with said switching means ($T_R$), a resistor (R') and said piezoelectric vibrator (P) being connected, in parallel with said coil (L) and said diode (D), in series with said switching means ($T_R$), said sound generator circuit (300) further including comparing means (COMP) for comparing the voltage across the terminals of said piezoelectric vibrator (P) with a reference voltage (+E) when an acoustic time-setting signal (50) is received.

9. Portable object according to claim 8, characterised in that said switching means ($T_R$) include a transistor.

* * * * *